United States Patent [19]

Watanabe

[11] Patent Number: 4,689,659
[45] Date of Patent: Aug. 25, 1987

[54] TEMPERATURE CONTROLLER FOR SEMICONDUCTOR DEVICE
[75] Inventor: Hideo Watanabe, Kanagawa, Japan
[73] Assignee: Fuji Photo Film Co., Ltd., Japan
[21] Appl. No.: 827,888
[22] Filed: Feb. 10, 1986
[30] Foreign Application Priority Data Feb. 18, 1985 [JP] Japan .................................. 60-30116

[51] Int. Cl.⁴ ..................... H01L 23/06; H01L 23/38; H01S 3/045; H05K 7/20
[52] U.S. Cl. ....................................... 357/81; 357/28; 357/87; 372/34; 372/36; 361/388
[58] Field of Search ............................ 357/28, 87, 81; 361/140, 381, 386, 387, 388; 372/36, 34

[56] References Cited
U.S. PATENT DOCUMENTS 4,403,243  9/1983  Hakamada ............................ 357/81
4,571,728  2/1986  Yoshikawa ........................... 357/87
4,604,753  8/1986  Sawai .................................. 372/36

FOREIGN PATENT DOCUMENTS 55-118659  9/1980  Japan ..................................... 357/28
59-27568   2/1984  Japan ..................................... 357/28
59-112675  6/1984  Japan ..................................... 372/36

Primary Examiner—Andrew J. James
Assistant Examiner—John Lamont
Attorney, Agent, or Firm—Gerald J. Ferguson, Jr.; Michael P. Hoffman; Ronni S. Malamud

[57] ABSTRACT

A temperature controller includes a temperature sensor mounted on a semiconductor device to be controlled in temperature, a temperature controlling assembly mounted on the semiconductor device and responsive to an output signal from the temperature sensor for controlling the temperature of the semiconductor device so as to be substantially constant, and a thermal insulation disposed around the semiconductor device and the temperature sensor in contact therewith. Since the temperature of the semiconductor device is directly detected by the temperature sensor, and directly controlled by the temperature controlling assembly, the temperature of the semiconductor device can be controlled quickly. The temperature of the semiconductor device can also be controlled highly accurately since the temperature sensor and the temperature controlling assembly are mounted directly on the semiconductor device and surrounded by the thermal insulation.

8 Claims, 3 Drawing Figures

TEMPERATURE CONTROLLER FOR SEMICONDUCTOR DEVICE

BACKGROUND OF THE INVENTION

1. Field of the Invention

The present invention relates to a temperature controller for a semiconductor device, and more particularly to a temperature controller capable of accurately and quickly controlling the temperature of a semiconductor device.

2. Description of the Prior Art

As is well known in the art, semiconductor devices are widely used in various electronic components and devices such as transistors, integrated circuits, and the like. Many light beam scanners such as scanning recorders and scanning readers for deflecting and scanning a light beam with a light beam deflector employ semiconductor lasers as means for emitting such a scanning light beam.

The semiconductor devices are highly temperature-dependent. It is necessary to effect highly accurate temperature control on certain semiconductor devices such as a semiconductor laser which must be as free as possible from output power changes dependent on temperature variations. Various arrangements are known for controlling the temperature of such a semiconductor device. For example, the semiconductor device to be controlled is attached to a heat-radiating panel to enable the latter to radiate the heat transmitted from the semiconductor device. If desired, a temperature sensor is attached to the heat-radiating panel, and a temperature controlling element such as an electronic cooling device or a heater is coupled to the heat-radiating panel, which is bodily controlled in temperature by the temperature controlling element in response to an output signal from the temperature sensor.

With the aforesaid known arrangement, however, the temperature of the semiconductor device is detected and controlled through the heat-radiating panel by the temperature sensor and the temperature controlling element attached thereto. As a consequence, it takes a certain period of time before the semiconductor device is fully controlled in temperature. Another problem is that it is difficult to effect accurate temperature control because the overall heat-radiating panel has a large heat capacity.

SUMMARY OF THE INVENTION

In view of the above problem of the conventional temperature controllers, it is an object of the present invention to provide a temperature controller capable of highly accurately and quickly controlling the temperature of a semiconductor device such as a semiconductor laser.

According to the present invention, a temperature controller includes a temperature sensor mounted on a semiconductor device to be controlled in temperature, temperature controlling means mounted on the semiconductor device and responsive to an output signal from the temperature sensor for controlling the temperature of the semiconductor device so as to be substantially constant, and a thermal insulation disposed around the semiconductor device and the temperature sensor in contact therewith. Since the temperature of the semiconductor device is directly detected by the temperature sensor, and directly controlled by the temperature controlling means, the temperature of the semiconductor device can be controlled quickly or at a high speed. The temperature of the semiconductor device can also be controlled with high accuracy since the temperature sensor and the temperature controlling means are mounted directly on the semiconductor device and surrounded by the thermal insulation.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
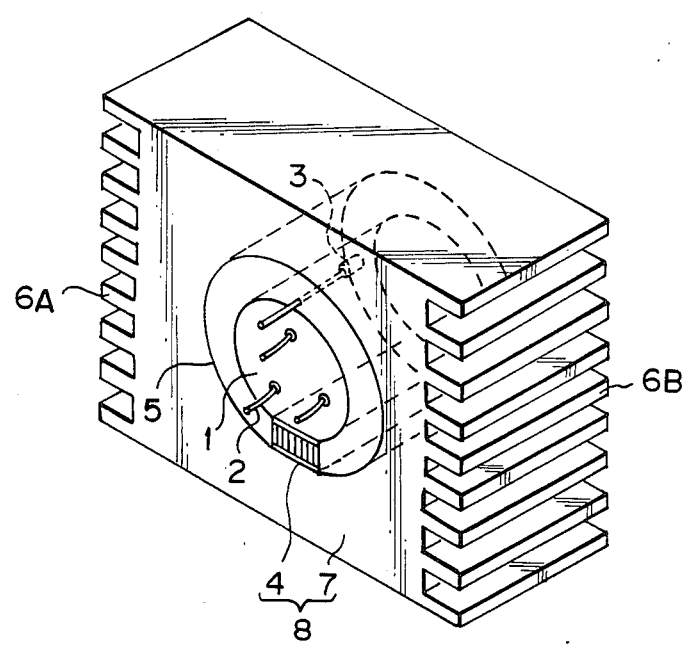
FIG. 1 is a perspective view of a temperature controller for a semiconductor device according to an embodiment of the present invention.

As shown in FIG. 1, a semiconductor device 1 such as a semiconductor laser can be energized by an electric current supplied over leads 2 connected thereto. A temperature sensor 3 such as a thermistor is disposed on the central surface of an upper end of the semiconductor device 1 for directly detecting the temperature of the semiconductor device 1. An electronic cooling device 4 such as a Peltier-effect device serving as a temperature controlling element is disposed on the surface of a lower end of the semiconductor device 1. The semiconductor device 1 is directly cooled by the electronic cooling device 4 when the temperature of the semiconductor device 1 rises beyond a predetermined temperature.

The semiconductor device 1 and the temperature sensor 3 are surrounded by a cylindrical thermal insulation 5 such as of sponge, cork, or urethane. The electronic cooling device 4 has opposite side surfaces held in contact with the thermal insulation 5. The semiconductor device 1, the temperature sensor 3, the electronic cooling device 4, and the thermal insulation 5 are embedded in a block-shaped heat sink 7 made of a material of high thermal conductivity and serving as a heat-radiating panel. The heat sink 7 has integral heat-radiating fins 6A, 6B on its opposite sides, the heat sink 7 and the electronic cooling device 4 jointly constituting a temperature controlling means 8. When the electronic cooling device 4 is in operation, heat transmitted from the semiconductor device 1 to the electronic cooling device 4 therebelow and then discharged downwardly from the electronic cooling device 4 is absorbed by the heat sink 7, from which the heat is discharged out through the surfaces of the heat sink 7 and the heat-radiating fins 6A, 6B.

Figure 2:
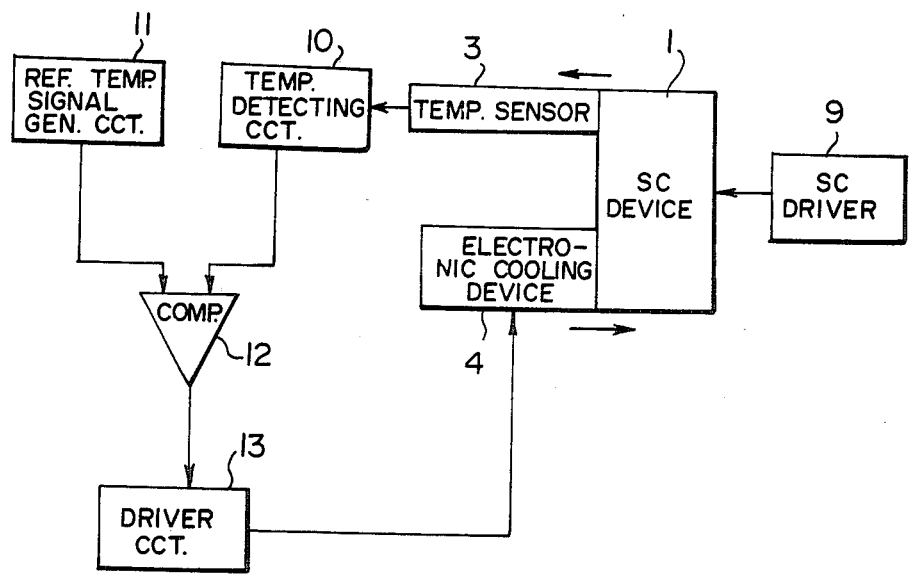
FIG. 2 is a block diagram of the temperature controller connected to control the temperature of the semiconductor device.

Operation of the temperature sensor 3 and the electronic cooling device 4 will be described in greater detail with reference to FIG. 2.

When the semiconductor device 1 is supplied with an electric current from a semiconductor device driver circuit 9, the semiconductor device 1 is energized. The temperature sensor 3 held against the semiconductor device 1 continuously detects the temperature of the semiconductor device 1 in operation, and delivers a signal representing the detected temperature to a temperature detecting circuit 10. The temperature detecting circuit 10 is responsive to the signal from the temperature sensor 3 for producing a temperature signal which is applied to a comparator 12. The comparator 12 then compares the applied temperature signal with a predetermined reference temperature signal from a reference temperature signal generating circuit 11. If the temperature of the semiconductor device 1 as indicated by the temperature signal is higher than a desired temperature for the semiconductor device 1, as represented by the reference temperature signal, then the comparator 12 issues a signal for energizing a temperature controlling element driver circuit 13. The driver circuit 13 is therefore energized to drive the electronic cooling device 4 for cooling the semiconductor device 1. When the temperature of the semiconductor device 1 is lowered to the predetermined desired temperature, the comparator 12 stops generating the signal, thus de-energizing the electronic cooling device 5.

Since the temperature sensor 3 and the electronic cooling device 4 are directly mounted on the semiconductor device 1, the temperature of the semiconductor device 1 can be detected quickly by the temperature sensor 3, and controlled quickly by the electronic cooling device 4 which directly cools the semiconductor device 1 only. The temperature of the semiconductor device 1 can also be controlled with high accuracy inasmuch as the semiconductor device 1 and the temperature sensor 3 are surrounded by the thermal insulation 5 together with the fact that the temperature sensor 3 and the electronic cooling device 4 are directly mounted on the semiconductor device 1.

Figure 3:
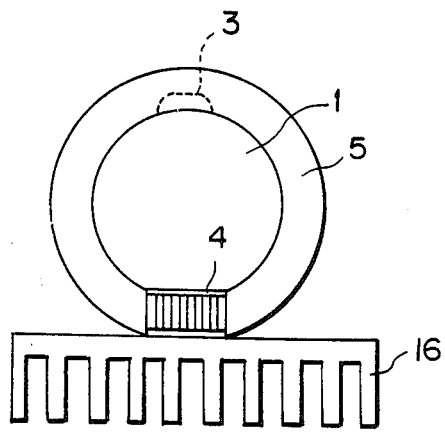
FIG. 3 is a front elevational view of a temperature controller according to another embodiment of the present invention.

The heat-radiating panel may comprise, rather than the heat sink with the heat-radiating fins, a heat-radiating fin 16 (FIG. 3) coupled directly to the lower end of the electronic cooling device 4. Various semiconductor device attachment bases to which the semiconductor device, the temperature sensor, the temperature controlling element, and the thermal insulation are attached may be used as heat-radiating panels.

Depending on the characteristics of the semiconductor device used and the environment in which it is used, the temperature controlling element may be a heater disposed on the semiconductor device, rather than the cooling device. Where a heater is employed, the heat-radiating panel such as the heat sink or the heat-radiating fins may be dispensed with. The cooling device for cooling the semiconductor device is not limited to the electronic cooling device, but may be of a different design. A Peltier-effect device used as the electronic cooling device absorbs heat when an electric current is passed in one direction, and produces heat when an electric current is passed in the reverse direction. By controlling the Peltier-effect device so that it can double as both an electronic cooling and a heating device, the temperature of the semiconductor devices can be controlled when they are heated and cooled excessively.

According to the present invention, as described above, a temperature sensor for detecting the temperature of a semiconductor device and temperature controlling means for controlling the temperature of the semiconductor device are directly mounted on the semiconductor device, and a thermal insulation is disposed in surrounding relation to the semiconductor device and the temperature sensor. With this construction, the temperature of the semiconductor device can be controlled highly accurately and quickly.

Although certain preferred embodiments have been shown and described, it should be understood that many changes and modifications may be made therein without departing from the scope of the appended claims.

I claim:

1. A temperature controller for controlling the temperature of a semiconductor device, comprising:
   (i) a temperature sensor mounted on the semiconductor device;
   (ii) temperature controlling means mounted on said semiconductor device and responsive to an output signal from said temperature sensor for controlling the temperature of said semiconductor device so as to be substantially constant; and
   (iii) a solid thermal insulation disposed around said semiconductor device and said temperature sensor in contact therewith.

2. A temperature controller according to claim 1, wherein said temperature controlling means comprises a temperature controlling element held in contact with said semiconductor device and having ends contacting said thermal insulation.

3. A temperature controller according to claim 2, wherein said temperature controlling means also includes a block-shaped heat sink surrounding said thermal insulation.

4. A temperature controller according to claim 3, wherein said block-shaped heat sink has heat-radiating fins on its opposite sides.

5. A temperature controller according to claim 2, wherein said temperature controlling means also includes a heat-radiating fin coupled to said temperature controlling element.

6. A temperature controller according to claim 2, wherein said temperature sensor is disposed on one end of said semiconductor device, and said temperature controlling element is disposed on the opposite end of said semiconductor device.

7. A temperature controller according to claim 2, wherein said temperature controlling element comprises a Peltier-effect device.

8. A temperature controller according to claim 1, wherein said thermal insulation is cylindrical in shape.

* * * * *